(12) United States Patent
Kim

(10) Patent No.: US 12,014,659 B2
(45) Date of Patent: Jun. 18, 2024

(54) DISPLAY DEVICE

(71) Applicant: Samsung Display Co., LTD., Yongin-si (KR)

(72) Inventor: Hyun Gue Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 341 days.

(21) Appl. No.: 17/572,434

(22) Filed: Jan. 10, 2022

(65) Prior Publication Data

US 2023/0016385 A1 Jan. 19, 2023

(30) Foreign Application Priority Data

Jul. 12, 2021 (KR) ........................ 10-2021-0090993

(51) Int. Cl.
| | |
|---|---|
| *G09G 3/00* | (2006.01) |
| *H01L 33/00* | (2010.01) |
| *H01L 33/38* | (2010.01) |
| *H01L 33/54* | (2010.01) |
| *H01L 33/62* | (2010.01) |

(52) U.S. Cl.
CPC ............ *G09G 3/006* (2013.01); *H01L 33/005* (2013.01); *H01L 33/382* (2013.01); *H01L 33/54* (2013.01); *H01L 33/62* (2013.01); *H01L 2933/0016* (2013.01); *H01L 2933/0066* (2013.01)

(58) Field of Classification Search
CPC ...... H10K 71/00; H10K 71/861; H10K 59/10; H10K 59/12; H10K 59/123; H10K 59/127; H10K 59/1275; H01L 33/382; H01L 33/48; H01L 33/62; G09G 3/006; G09G 3/20

See application file for complete search history.

(56) References Cited

U.S. PATENT DOCUMENTS

| | | | |
|---|---|---|---|
| 2010/0026923 A1* | 2/2010 | Chen ................. | G02F 1/136259 349/55 |
| 2020/0203452 A1* | 6/2020 | Kang .................... | H01L 23/538 |
| 2020/0350301 A1* | 11/2020 | Zhai ..................... | H10K 59/126 |

FOREIGN PATENT DOCUMENTS

| | | |
|---|---|---|
| JP | 2011-048984 A | 3/2011 |
| KR | 10-1423557 B1 | 8/2014 |
| KR | 10-2019-0129998 A | 11/2019 |
| KR | 10-2020-0135069 A | 12/2020 |

\* cited by examiner

*Primary Examiner* — Huy Q Phan
*Assistant Examiner* — David B Frederiksen
(74) *Attorney, Agent, or Firm* — Lewis Roca Rothgerber Christie LLP

(57) ABSTRACT

A display device includes a display panel and a repair panel overlapping a region of the display panel. The display panel includes: a substrate; a plurality of transistors on the substrate; and a first electrode connected to the transistors. The repair panel includes: a repair substrate; a plurality of connection electrodes extending through the repair substrate and on opposite surfaces of the repair substrate; a first repair electrode connected to the connection electrodes; a first repair emission layer on the first repair electrode; and a repair common electrode on the first repair emission layer. In a region where the display panel and the repair panel overlap each other, the first electrode and the first repair electrode are electrically connected to each other through the connection electrode.

20 Claims, 17 Drawing Sheets

DISPLAY DEVICE

CROSS-REFERENCE TO RELATED APPLICATION

This application claims priority to and benefit of Korean Patent Application No. 10-2021-0090993, filed in the Korean Intellectual Property Office on Jul. 12, 2021, the entire content of which is incorporated herein by reference.

BACKGROUND

1. Field

Aspects of embodiments of the present disclosure relate to a display device.

2. Description of the Related Art

Mobile electronic devices are widely used. In addition to small electronic devices, such as mobile phones, tablet PCs have recently been widely used as mobile electronic devices.

A mobile electronic device generally includes a display panel for providing visual information, such as an image and/or a video, to a user to support various functions. Recently, as components for driving the display panel are miniaturized, a proportion of the display panel in electronic devices is gradually increasing, and a structure capable of being bent to have an angle (e.g., a predetermined angle) from a flat state is being developed.

The display panel as described above may determine whether there is a defect during or after a manufacturing process. When a defect of the display panel occurs (e.g., is determined or detected), the defect may be repaired in various suitable ways.

The above information disclosed in this Background section is for enhancement of understanding of the background of the present disclosure, and therefore, it may contain information that does not form the prior art that is already known to a person of ordinary skill in the art.

SUMMARY

Embodiments of the present disclosure provide a display device in which a defective region may be effectively repaired.

An embodiment of the present disclosure includes a display device including a display panel and a repair panel overlapping a region of the display panel. The display panel includes: a substrate; a plurality of transistors on the substrate; and a first electrode connected to the transistors. The repair panel includes: a repair substrate; a plurality of connection electrodes extending through the repair substrate and on opposite surfaces of the repair substrate; a first repair electrode connected to the connection electrodes; a first repair emission layer on the first repair electrode; and a repair common electrode on the first repair emission layer. In a region where the display panel and the repair panel overlap each other, the first electrode and the first repair electrode are electrically connected to each other through the connection electrode.

The display panel may further include an auxiliary electrode on a same layer as that of the first electrode, and the repair panel may further include a repair auxiliary electrode on a same layer as that of the first repair electrode. The repair auxiliary electrode may be electrically connected to the repair common electrode, and the auxiliary electrode and the repair auxiliary electrode may be electrically connected to each other through the connection electrode.

The display device may further include a conductive ball between the first electrode and the connection electrode.

The display device may further include: a first conductive ball between the first electrode and the connection electrode; and a second conductive ball between the auxiliary electrode and the connection electrode.

The display panel, at a region that does not overlap the repair panel, may further include: a first emission layer on the first electrode; a common electrode on the first emission layer; and an auxiliary electrode on a same layer as that of the first electrode and electrically connected to the common electrode.

The display panel may further include a second electrode and a third electrode on a same layer as that of the first electrode.

The repair panel may further include: a second repair electrode and a third repair electrode on a same layer as that of the first repair electrode; a second repair emission layer on the second repair electrode; and a third repair emission layer on the third repair electrode.

In a region where the display panel and the repair panel overlap each other, the second electrode may be electrically connected to the second repair electrode through the connection electrode, and the third electrode and the third repair electrode may be electrically connected to each other through the connection electrode.

In a region where the display panel and the repair panel overlap each other, the first repair emission layer, the second repair emission layer, and the third repair emission layer may be configured to emit light when a voltage is applied to the display device.

A thickness of the display device in a region where the repair panel is positioned may be thicker than a region where the repair panel is not positioned.

The repair panel may further include a repair encapsulation layer on the repair common electrode.

The display device may further include an encapsulation layer on the repair encapsulation layer, and the encapsulation layer may be integrally positioned on the repair panel and on the display panel that does not overlap the repair panel.

According to another embodiment of the present disclosure, a repair method for a display device including a display panel using a repair panel is provided. The display panel includes: a substrate; a plurality of transistors on the substrate; and a first electrode connected to the transistors. The repair panel includes: a repair substrate; a plurality of connection electrodes extending through the repair substrate and on opposite surfaces of the repair substrate; a first repair electrode connected to the connection electrodes; a first repair emission layer on the first repair electrode; and a repair common electrode on the first repair emission layer. The repair method includes: determining whether or not a defective region is present by turning on the display panel; removing an emission layer and a common electrode from the display panel by irradiating a laser to the defective region of the display panel; positioning the repair panel on the display panel irradiated with the laser; and electrically connecting the first electrode and the connection electrode in a region where the display panel and the repair panel overlap each other.

The display panel may further include an auxiliary electrode on a same layer as that of the first electrode, and the repair panel may further include a repair auxiliary electrode on a same layer as that of the first repair electrode. The repair auxiliary electrode may be electrically connected to the repair common electrode, and the auxiliary electrode and the repair auxiliary electrode may be electrically connected to each other through the connection electrode.

After the positioning of the repair panel on the display panel irradiated with the laser, a laser may be irradiated to a region where the repair auxiliary electrode and the auxiliary electrode are connected to couple the display panel and the repair panel to each other.

The repair method may further include, before the positioning of the repair panel on the display panel irradiated with the laser, positioning a conductive ball between the display panel and the repair panel.

The conductive ball may be positioned between the first electrode and the connection electrode and between the auxiliary electrode and the connection electrode.

The repair panel may further include a repair encapsulation layer on the repair common electrode, and an encapsulation layer may be integrally disposed on the repair encapsulation layer and the display panel which does not overlap the repair panel.

A thickness of the display device in a region where the repair panel is positioned may be thicker than a region where the repair panel is not positioned.

The display panel, in a region that does not overlap the repair panel, may further include: a first emission layer on the first electrode; the common electrode on the first emission layer; and an auxiliary electrode on a same layer as that of the first electrode and electrically connected to the common electrode.

According to embodiments of the present disclosure, a display device is provided that is capable of effectively repairing a defective region.

DETAILED DESCRIPTION

Figure 1:
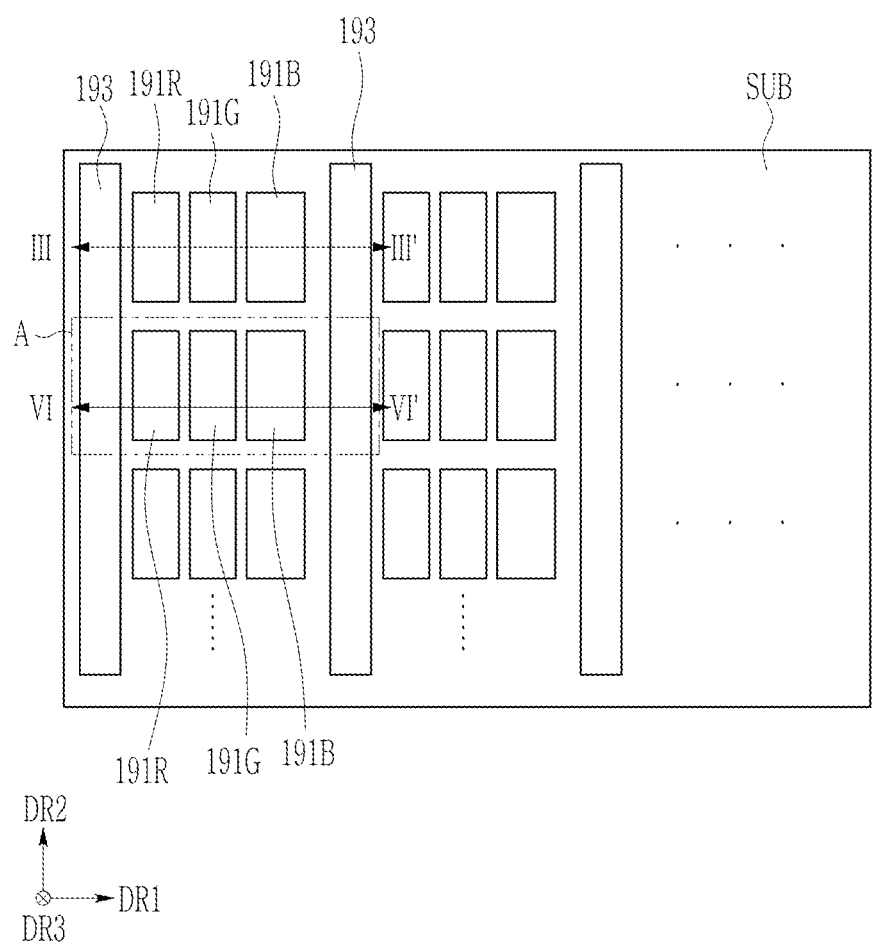
FIG. 1 illustrates a schematic top plan view of a display device according to an embodiment.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

To clearly describe the present disclosure, parts that are not necessary to understand the description may be omitted, and like numerals refer to like or similar constituent elements throughout the specification.

Further, sizes and thicknesses of constituent members shown in the accompanying drawings are arbitrarily given for better understanding and ease of description. Therefore, the present disclosure is not limited to the illustrated sizes and thicknesses. For example, in the drawings, the thicknesses of layers, films, panels, regions, etc., may be exaggerated for clarity and the thicknesses of some layers and areas may be exaggerated.

It will be understood that when an element, such as a layer, film, region, or substrate, is referred to as being "on" another element, it can be directly on the other element or intervening elements may also be present. When an element is referred to as being "directly on" another element, there are no intervening elements present. Further, in the specification, the word "on" or "above" means positioned on or below the object portion and does not necessarily mean positioned on the upper side of the object portion based on a gravitational direction.

In addition, unless explicitly described to the contrary, the words "include," "have," and "comprise," and variations, such as "includes," "including," "has," "having," "comprises," or "comprising," will be understood to imply the inclusion of stated elements but not the exclusion of any other elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Further, in the specification, the phrase "in a plan view" means when an object portion is viewed from above, and the phrase "in a cross-sectional view" means when a cross-section taken by vertically cutting an object portion is viewed from the side.

Hereinafter, a display device according to an embodiment of the present disclosure will be described, in detail, with reference to the drawings. FIG. 1 is a schematic top plan view of a display device showing only some components according to an embodiment. Referring to FIG. 1, the display device according to the present embodiment may include a substrate SUB, a first electrode 191R, a second electrode 191G, a third electrode 191B, and an auxiliary electrode 193 positioned on the substrate SUB. The first electrode 191R, the second electrode 191G, the third electrode 191B, and the auxiliary electrode 193 may be positioned at a same layer and may include a same material. The first electrode 191R, the second electrode 191G, and the third electrode 191B may each correspond to one pixel, and may constitute light emitting elements emitting light of different colors. For example, the first electrode 191R may constitute a red light emitting element, the second electrode 191G may constitute a green light emitting element, and the third electrode 191B may constitute a blue light emitting element. As illustrated in FIG. 1, a size of the third electrode 191B may be the largest from among the first through third electrodes 191R, 191G, and 191B, but the present disclosure is not limited thereto.

The first electrode 191R, the second electrode 191G, and the third electrode 191B may be positioned side-by-side (e.g., may be adjacent each other) in a first direction DR1. The auxiliary electrode 193 may extend along a second direction DR2 that crosses (e.g., is perpendicular to) the first direction DR1. The first electrode 191R, the second electrode 191G, and the third electrode 191B may be positioned between auxiliary electrodes 193, which are adjacent in the first direction DR1.

Figure 2:
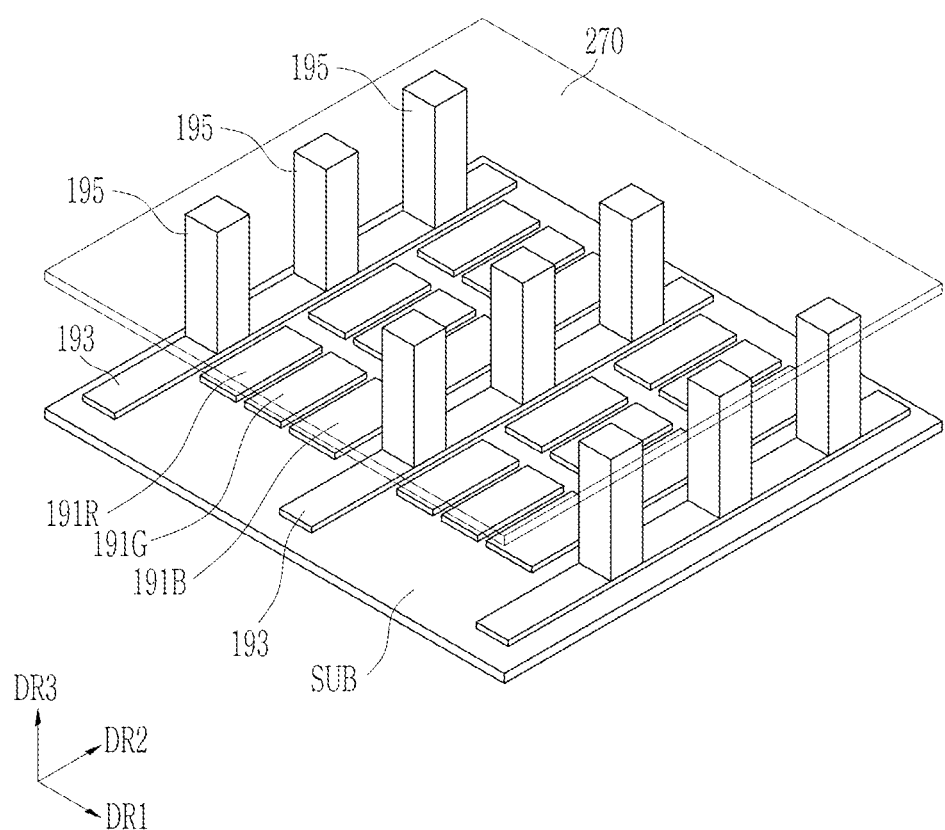
FIG. 2 illustrates a schematic 3D view of the display device shown in FIG. 1.

FIG. 2 illustrates a schematic 3D view of the display device shown in FIG. 1. Referring to FIG. 2, the first electrode 191R, the second electrode 191G, the third electrode 191B, and the auxiliary electrode 193 are positioned on the substrate SUB.

In addition, a common electrode 270 may be positioned at a position facing (e.g., over) the substrate SUB. The common electrode 270 may have a plate shape. Referring to FIG. 2, a protrusion 195 protruding in a third direction DR3 is formed in a region of (e.g., is formed over) the auxiliary electrode 193. The protrusion 195 contacts the common electrode 270. Accordingly, the common electrode 270 and the auxiliary electrode 193 may be electrically connected to each other. When a common voltage is supplied to the common electrode 270, the common voltage is also transferred to the auxiliary electrode 193. Accordingly, it is possible to prevent or substantially prevent an IR drop phenomenon that may occur when a voltage is applied to the common electrode 270 having a plate shape and covering a large area.

In the display device according to the present embodiment, a region thereof may be repaired. For example, a separate repair panel may be stacked in the repair region. In FIG. 1, the repair region is indicated by "A".

For example, a lighting test may be performed to check whether or not there is a defect during the manufacturing process of the display panel. A defective region does not emit light, and thus, a defective region is identified as a dark spot.

When some of light emitting elements included in the display panel are defective, the corresponding area may be repaired. When the defect originates from an emission layer, repair may be difficult. However, the display device according to the present embodiment effectively allows for such repairs to the display panel by stacking a separate repair panel in the repair region. Hereinafter, a configuration of the present disclosure will be described in more detail.

Figure 3:
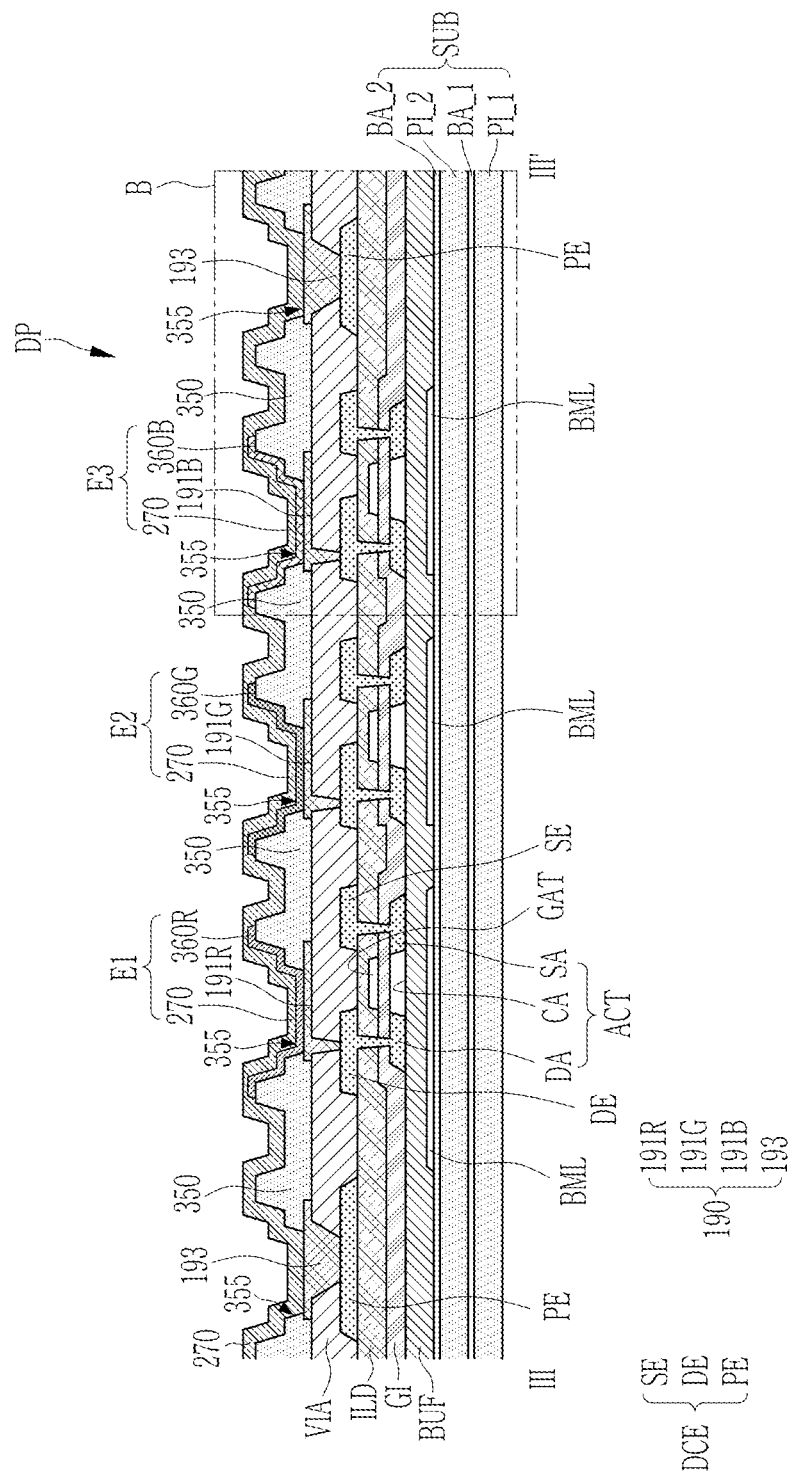
FIG. 3 illustrates a cross-sectional view taken along the line III-III' in FIG. 1.

FIG. 3 illustrates a cross-sectional view taken along the line III-III' in FIG. 1. FIG. 3 illustrates a cross-section of a non-repaired region of the display device.

Referring to FIG. 3, the display panel DP includes the substrate SUB and a light blocking layer BML positioned on the substrate SUB. The substrate SUB may have a single layer or a multilayer structure as illustrated in FIG. 3. For example, the substrate SUB may have a multilayer structure including a first polymer layer PI_1, a first barrier layer BA_1, a second polymer layer PI_2, and a second barrier layer BA_2 as illustrated in FIG. 3. The first polymer layer PI_1 and the second polymer layer PI_2 may each include polyimide.

The light blocking layer BML may include a metal. As illustrated in FIG. 3, the light blocking layer BML may overlap a semiconductor layer ACT to prevent or substantially prevent light from being incident on the semiconductor layer ACT.

Referring to FIG. 3, a buffer layer BUF is positioned on the light blocking layer BML. The barrier layer BUF may include an inorganic insulating material, such as a silicon nitride ($SiN_x$), a silicon oxide ($SiO_x$), and a silicon oxynitride ($SiO_xN_y$). The buffer layer BUF may have a single layer structure or a multilayer structure of the material.

The semiconductor layer ACT may be disposed on the buffer layer BUF. The semiconductor layer ACT may include any one of amorphous silicon, polycrystalline silicon, and an oxide semiconductor. For example, the semiconductor layer ACT may include low temperature polysilicon (LTPS) or may include an oxide semiconductor material including at least one of zinc (Zn), indium (In), gallium (Ga), tin (Sn), and a mixture thereof. For example, the semiconductor layer ACT may include an indium-gallium-zinc oxide (IGZO).

The semiconductor layer ACT may have a source region SA, a channel region CA, and a drain region DA.

A gate insulating layer GI may be disposed on the semiconductor layer ACT. The gate insulating layer GI may include an inorganic insulating material, such as a silicon nitride ($SiN_x$), a silicon oxide ($SiO_x$), and a silicon oxynitride ($SiO_xN_y$). The gate insulating layer GI may have a single layer structure or a multilayer structure of the material.

A gate electrode GAT may be disposed on the gate insulating layer GI. The gate electrode GAT may include molybdenum (Mo), aluminum (Al), copper (Cu), and/or titanium (Ti) and may have a single layer structure or a multilayer structure of the material. The gate electrode GAT may be positioned to overlap the channel region CA of each semiconductor layer ACT.

An interlayer insulating layer ILD may be disposed on the gate electrode GAT. The interlayer insulating layer GI_2 may include an inorganic insulating material, such as a silicon nitride ($SiN_x$), a silicon oxide ($SiO_x$), and a silicon oxynitride ($SiO_xN_y$).

A data conductive layer DCE may be disposed on the interlayer insulating layer ILD. The data conductive layer DCE may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), etc. and may have a single layer structure or a multilayer structure of the material.

The data conductive layer DCE may include a source electrode SE, a drain electrode DE, and a pad electrode PE. The source electrode SE may be electrically connected to the source region SA of each semiconductor layer ACT, and the drain electrode DE may be electrically connected to the drain region DA of each semiconductor layer ACT.

The pad electrode PE may not overlap (e.g., may be offset from) the semiconductor layer ACT. The pad electrode PE may be positioned to overlap the auxiliary electrode 193.

An insulating layer VIA may be disposed on the data conductive layer DCE. The insulating layer VIA may be an inorganic layer. For example, the insulating layer VIA may include an organic insulating material, such as a general purpose polymer, e.g., poly(methyl methacrylate) (PMMA) or polystyrene (PS), a polymer derivative having a phenolic group, an acrylic polymer, an imide polymer, a polyimide, a siloxane polymer, etc.

An electrode layer 190 may be disposed on the insulating layer VIA. The electrode layer 190 may include the first electrode 191R, the second electrode 191G, the third electrode 191B, and the auxiliary electrode 193. The first electrode 191R, the second electrode 191G, and the third electrode 191B may each be electrically connected to one of the drain electrodes DE. The auxiliary electrode 193 may be electrically connected to the pad electrode PE. Planar shapes of the first electrode 191R, the second electrode 191G, the third electrode 191B, and the auxiliary electrode 193 may be the same as those illustrated in FIG. 1 and FIG. 2.

A partition wall 350 may be positioned on the insulating layer VIA and the electrode layer 190.

The partition wall 350 may have openings 355 overlapping the first electrode 191R, the second electrode 191G, the third electrode 191B, and the auxiliary electrode 193, respectively. Although illustrated as being separated from each other in FIG. 3, the partition wall 350 may be a single unit in a plan view and may have a structure in which openings are formed in regions overlapping each of the first electrode 191R, the second electrode 191G, the third electrode 191B, and the auxiliary electrode 193.

A first emission layer 360R may be disposed in the opening 355 in the partition wall 350 overlapping the first electrode 191R. The first emission layer 360R may be a red emission layer.

A second emission layer 360G may be disposed in the opening 355 in the partition wall 350 overlapping the second electrode 191G. The second emission layer 360G may be a green emission layer.

A third emission layer 360B may be disposed in the opening 355 in the partition wall 350 overlapping the third electrode 191B. The third emission layer 360B may be a blue emission layer.

No emission layer may be disposed in the opening 355 in the partition wall 350 overlapping the auxiliary electrode 193.

Next, the common electrode 270 may be positioned (or formed) on the partition wall 350, the first emission layer 360R, the second emission layer 360G, the third emission layer 360B, and the auxiliary electrode 193.

As illustrated in FIG. 2, the auxiliary electrode 193 may be electrically connected to the common electrode 270 to receive a common voltage. Accordingly, an IR drop may be prevented or substantially prevented when a voltage is applied to the plate-shaped common electrode 270.

The first electrode 191R, the first emission layer 360R, and the common electrode 270 may form (e.g., may constitute) a first light emitting element E1. Similarly, the second electrode 191G, the second emission layer 360G, and the common electrode 270 may form (e.g., may constitute) a second light emitting element E2. In addition, the third electrode 191B, the third emission layer 360B, and the common electrode 270 may form (e.g., may constitute) a third light emitting element E3.

FIG. 3 illustrates a region that is not repaired in the display device according to the present embodiment, and in FIG. 1, a region in which the repair panel is positioned after being repaired is indicated by A.

Figure 4:
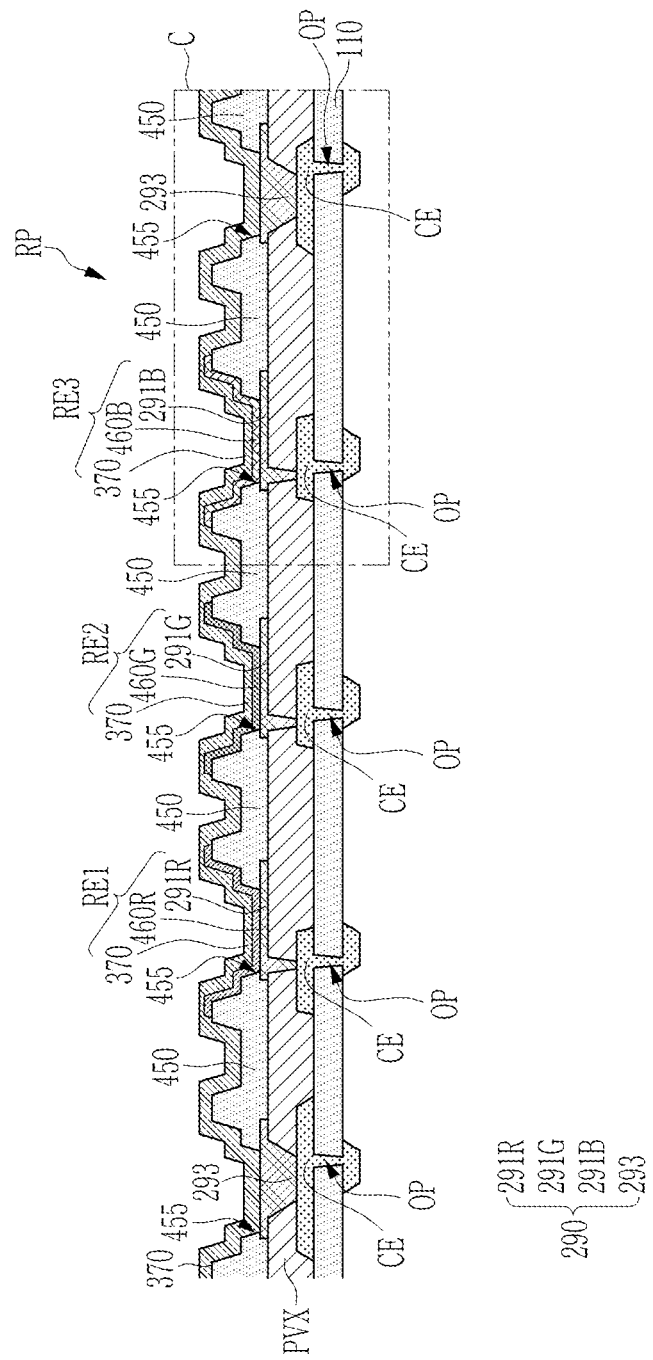
FIG. 4 illustrates a cross-section of the repair panel positioned at the region A in FIG. 1.

FIG. 4 illustrates a cross-section of the repair panel positioned at the region A of FIG. 1. FIG. 4 illustrates a cross-sectional view of a repair panel RP before being coupled to a display panel.

Referring to FIG. 4, the repair panel RP according to the present embodiment includes a repair substrate 110 and a connection electrode CE positioned on the repair substrate 110. The repair substrate 110 may include polyimide, but the present disclosure is not limited thereto. As illustrated in FIG. 4, the repair substrate 110 has a plurality of openings OP, and the connection electrodes CE are positioned at opposite sides of the repair substrate 110 to be connected through the openings OP. For example, the connection electrodes CE are positioned on opposite surfaces of the repair substrate 110 while penetrating (e.g., while extending through) the repair substrate 110.

The connection electrode CE may be formed by a method of first forming an opening OP in the repair substrate 110, forming the connection electrode CE on a first surface, and then forming the connection electrode CE on a second surface of the repair substrate 110.

Next, a passivation layer PVX may be positioned on the connection electrode CE. The passivation layer PVX may include an inorganic insulating material, such as a silicon nitride ($SiN_x$), a silicon oxide ($SiO_x$), and a silicon oxynitride ($SiO_xN_y$). In other embodiments, the passivation layer PVX may include an organic insulating material, such as a general purpose polymer, e.g., poly(methyl methacrylate) (PMMA) or polystyrene (PS), a polymer derivative having a phenolic group, an acrylic polymer, an imide polymer, a polyimide, a siloxane polymer, etc.

A repair electrode layer 290 may be disposed on the passivation layer PVX. The repair electrode layer 290 may include a first repair electrode 291R, a second repair electrode 291G, a third repair electrode 291B, and a repair auxiliary electrode 293.

Each of the first repair electrode 291R, the second repair electrode 291G, the third repair electrode 291B, and the repair auxiliary electrode 293 may be electrically connected to the connection electrodes CE through openings in the passivation layer PVX.

A repair partition wall 450 may be positioned on the passivation layer PVX and the repair electrode layer 290.

The repair partition wall 450 may have openings 455 overlapping the first repair electrode 291R, the second repair electrode 291G, the third repair electrode 291B, and the repair auxiliary electrode 293, respectively. Although illustrated as being separated from each other in FIG. 4, the repair partition wall 450 may be a single unit in a plan view and may have a structure in which openings 455 are formed in regions overlapping each of the first repair electrode 291R, the second repair electrode 291G, the third repair electrode 291B, and the repair auxiliary electrode 293.

A first repair emission layer 460R may be disposed in the opening 455 in the repair partition wall 450 overlapping the first repair electrode 291R. The first repair emission layer 460R may be a red emission layer.

A second repair emission layer 460G may be disposed in the opening 455 in the repair partition wall 450 overlapping the second repair electrode 291G. The second repair emission layer 460G may be a green emission layer.

A third repair emission layer 460B may be disposed in the opening 455 in the repair partition wall 450 overlapping the third repair electrode 291B. The third repair emission layer 460B may be a blue emission layer.

No emission layer may be disposed in the opening 455 in the repair partition wall 450 overlapping the repair auxiliary electrode 293.

Next, a repair common electrode 370 may be positioned (e.g., formed) on the partition wall 350, the first repair electrode 291R, the second repair electrode 291G, the third repair electrode 291B, and the repair auxiliary electrode 293.

The first repair electrode 291R, the first repair emission layer 460R, and the repair common electrode 370 may form (e.g., may constitute) a first repair light emitting element RE1. Similarly, the second repair electrode 291G, the second repair emission layer 460G, and the repair common electrode 370 may form (e.g., may constitute) a second repair light emitting element RE2. In addition, the third repair electrode 291B, the third repair emission layer 460B, and the repair common electrode 370 may form (e.g., may constitute) a third repair light emitting element RE3.

As illustrated in FIG. 4, the repair panel RP may include the first repair light emitting element RE1, the second repair light emitting element RE2, and the third repair light emitting element RE3. When the light emitting element of the display panel is defective, such repair light emitting elements may be positioned on the light emitting element to emit light instead of the defective light emitting element.

Figure 5:
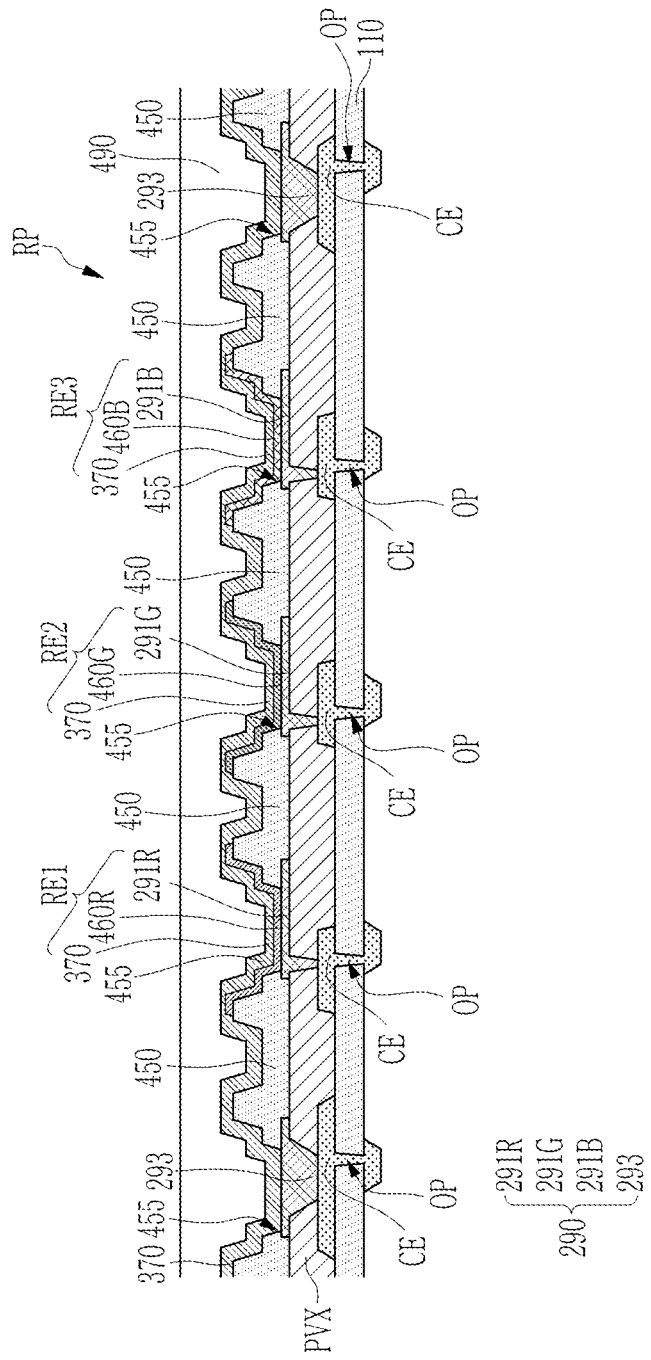
FIG. 5 illustrates a cross-section corresponding to FIG. 4 for a display device according to another embodiment.

FIG. 5 illustrates a cross-section corresponding to FIG. 4 for a display device according to another exemplary embodiment. The embodiment shown in FIG. 5 is the same as the embodiment shown in FIG. 4 except it further includes a repair encapsulation layer 490 positioned on the repair common electrode 370. A detailed description of same constituent elements may be omitted.

Referring to FIG. 5, the repair panel RP according to the present embodiment further includes the repair encapsulation layer 490 positioned on the repair common electrode 370. The repair encapsulation layer 490 may have a multi-layer structure in which organic layers and inorganic layers are alternately formed, but the present disclosure is not limited thereto. When the repair panel RP includes the repair encapsulation layer 490, it is easy to store the repair panel RP in ordinary times. For example, a pre-manufactured repair panel RP may be stored, and then may be used immediately when a display panel DP needs to be repaired. In this way, when the repair panel RP including the repair encapsulation layer 490 is used, both the repair encapsulation layer 490 and the encapsulation layer may be positioned on the final display device.

In FIG. 4 and FIG. 5, the repair panel RP is illustrated as having a configuration including a first repair electrode 291R, a second repair electrode 291G, a third repair electrode 291B, and two repair auxiliary electrodes 293, but this is merely an example, and the repair panel RP may be formed to have various lengths. For example, a length of the repair panel RP may vary according to a defect length occurring in the display panel DP.

Figure 6:
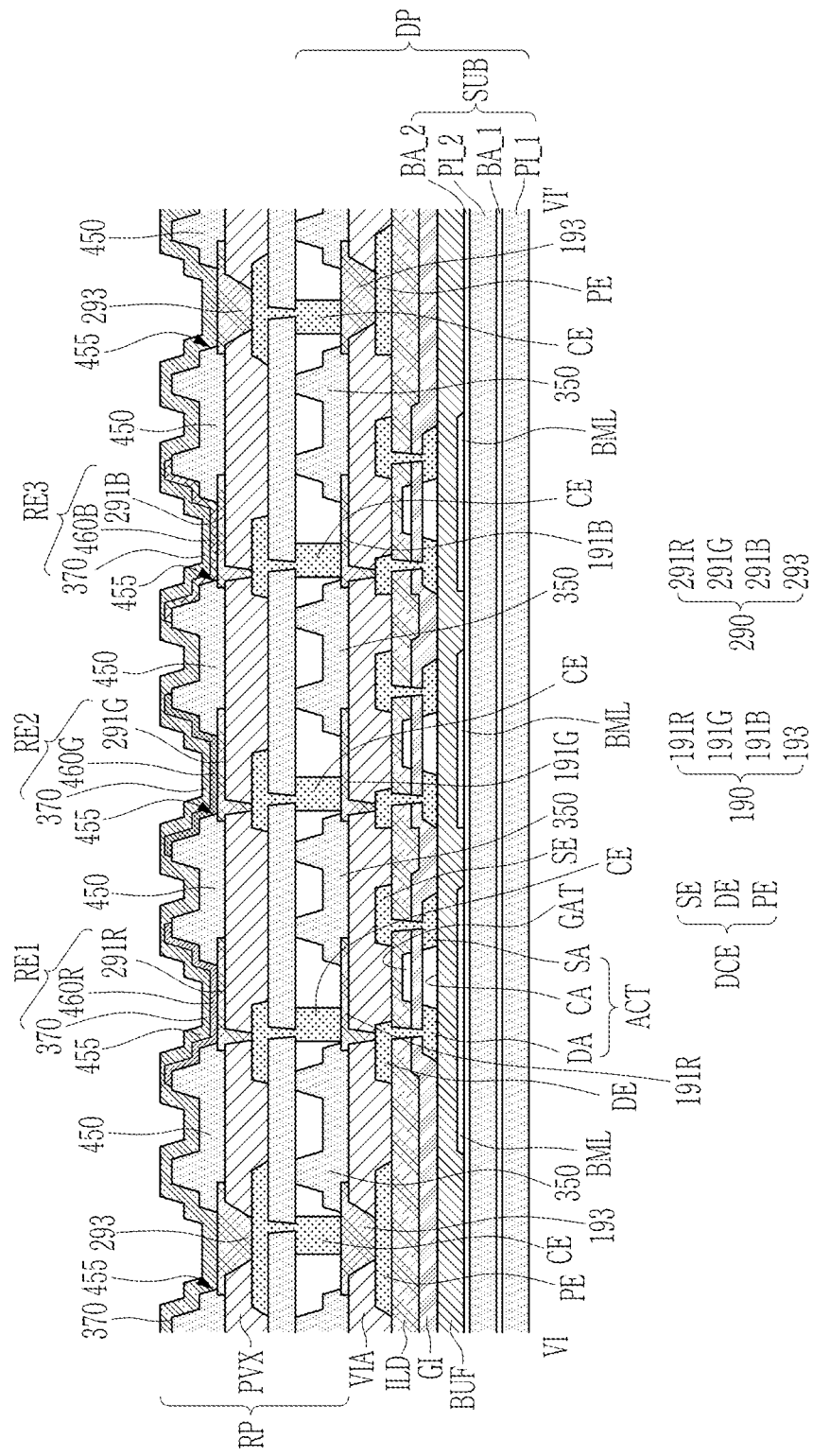
FIG. 6 illustrates a cross-sectional view taken along the line VI-VI' in FIG. 1.

Hereinafter, a repaired display device will be described with reference to the drawings. FIG. 6 illustrates a cross-sectional view taken along the line VI-VI' in FIG. 1. Referring to FIG. 6, the repair panel RP is positioned on the display panel DP.

In FIG. 6, an emission layer and a common electrode are removed from the display panel DP. That is, when a structure of the display panel DP shown in FIG. 6 is compared with FIG. 3, which illustrates the cross-section of the non-repaired display panel, the display panel DP shown in FIG. 6 is obtained by removing the first emission layer 360R, the second emission layer 360G, the third emission layer 360B, and the common electrode 270 from the display panel shown in FIG. 3. Although described separately later, a laser or tape may be used to remove the first emission layer 360R, the second emission layer 360G, the third emission layer 360B, and the common electrode 270 from the display panel.

Referring to FIG. 6, the repair panel RP is positioned on the display panel DP from which the emission layer and the common electrode have been removed. The connection electrode CE of the repair panel RP directly contacts the electrode layer 190 of the display panel DP.

For example, as shown in FIG. 6, the connection electrodes CE positioned below the repair substrate 110 of the repair panel RP may be positioned to respectively contact the first electrode 191R, the second electrode 191G, the third electrode 191B, and the auxiliary electrode 193 of the display panel DP.

Accordingly, a voltage supplied to the first electrode 191R, the second electrode 191G, the third electrode 191B, and the auxiliary electrode 193 of the display panel DP through the connection electrodes CE is transferred to the second repair electrode 291G, the third repair electrode 291B, and the repair auxiliary electrode 293.

The transferred voltages cause each of the first repair light emitting element RE1, the second repair light emitting element RE2, and the third repair light emitting element RE3 to emit light.

An adhesive or the like may be positioned in an empty space between the repair panel RP and the display panel DP. When the adhesive is positioned in a region between the repair panel RP and the display panel DP, the repair panel RP and the display panel DP may be better (e.g., more securely) fixed.

As illustrated in FIG. 6, in a repair region where the repair panel RP is positioned, the repair light emitting elements RE1, RE2, and RE3 positioned on the repair panel RP emit light instead of the light emitting element of the display panel DP. Accordingly, even when the light emitting element of the display panel DP is defective, it is possible to prevent that area from being visually recognized as a dark spot.

The display panel DP illustrated in FIG. 6 is the same as that in FIG. 3 except that the first emission layer 360R, the second emission layer 360G, the third emission layer 360B, and the common electrode 270 are removed from the display panel of FIG. 3, and thus, a detailed description of same components may be omitted. Similarly, because the structure of the repair panel RP illustrated in FIG. 6 is also the same as that shown in FIG. 4, a detailed description of same components may be omitted.

Referring to FIG. 6, the repair panel RP and the display panel DP may be coupled to each other such that the repair partition wall 450 and the partition wall 350 overlap each other. For example, as illustrated in FIG. 6, the opening 455 in the repair partition wall 450 and the opening 355 in the partition wall 350 may overlap each other in a direction that is perpendicular to a surface of the substrate SUB (e.g., in the third direction DR3).

Accordingly, the first electrode 191R and the first repair electrode 291R may overlap in the direction that is perpendicular to the surface of the substrate SUB, and a voltage supplied to the first electrode 191R may be transferred to the first repair electrode 291R through the connection electrode CE. Similarly, the second electrode 191G and the second repair electrode 291G may overlap in the direction that is perpendicular to the surface of the substrate SUB, and a voltage supplied to the second electrode 191G may be transferred to the second repair electrode 291G through the connection electrode CE. The third electrode 191B and the third repair electrode 291B may overlap in the direction that is perpendicular to the surface of the substrate SUB, and a voltage supplied to the third electrode 191B may be transferred to the third repair electrode 291B through the connection electrode CE.

Shapes of the first repair emission layer 460R, the second repair emission layer 460G, and the third repair emission layer 460B of the repair panel RP may be the same as those of the first emission layer 360R, the second emission layer 360G, and the third emission layer 360B of the display panel DP. In addition, sizes of the first repair emission layer 460R, the second repair emission layer 460G, and the third repair emission layer 460B of the repair panel RP may be similar to those of the first emission layer 360R, the second emission layer 360G, and the third emission layer 360B of the display panel DP. Accordingly, even when light is emitted from the repair light emitting device of the repair panel instead of the light emitting element of the display panel, emission efficiency of the entire display device may be uniformly maintained.

No light emitting element is positioned in a region where the auxiliary electrode 193 and the repair auxiliary electrode 293 are connected. Accordingly, a laser may be irradiated to a region connecting the auxiliary electrode 193 and the repair auxiliary electrode 293 to increase a coupling force through laser welding during a coupling process of the repair panel RP and the display panel DP.

Although FIG. 6 shows a configuration in which the connection electrode CE of the repair panel RP and the electrode layer 190 of the display panel DP directly contact each other, the connection electrode CE and the electrode layer 190 of the display panel DP may be electrically connected to each other through a conductive ball CB interposed therebetween according to an embodiment.

Figure 7:
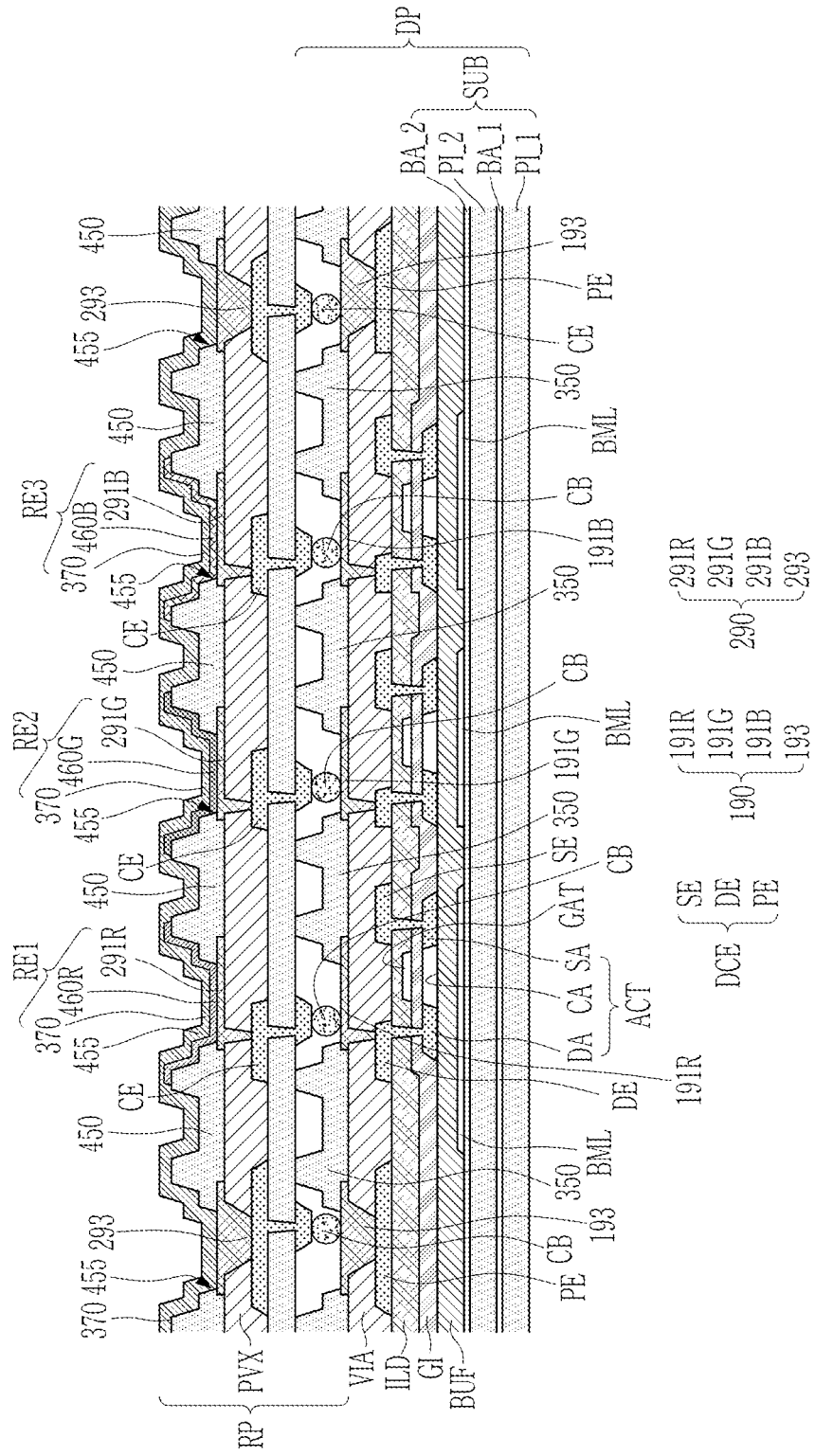
FIG. 7 illustrates a cross-section corresponding to FIG. 6 for a display device according to another embodiment.

FIG. 7 illustrates a cross-section corresponding to FIG. 6 for a display device according to another embodiment. Referring to FIG. 7, the display device according to the present embodiment is the same as that of the embodiment shown in FIG. 6 except that the connection electrode CE and the electrode layer 190 are not in direct contact with each other but are connected through the conductive ball CB. A detailed description of same constituent elements may be omitted.

As illustrated in FIG. 7, when the connection electrode CE and the electrode layer 190 are connected through the conductive ball CB, a thickness of the connection electrode CE positioned on a rear surface of the repair substrate 110 of the repair panel RP may be reduced. For example, in the embodiment shown in FIG. 6, the thickness of the connection electrode CE positioned on the rear surface of the repair substrate 110 may be increased for the connection electrode CE and the electrode layer 190 to directly contact each other, but in the embodiment shown in FIG. 7, they are connected through the conductive ball CB. Thus, the connection electrode CE positioned on the rear surface of the repair substrate 110 may be formed to be thinner than that in FIG. 6.

Figure 8:
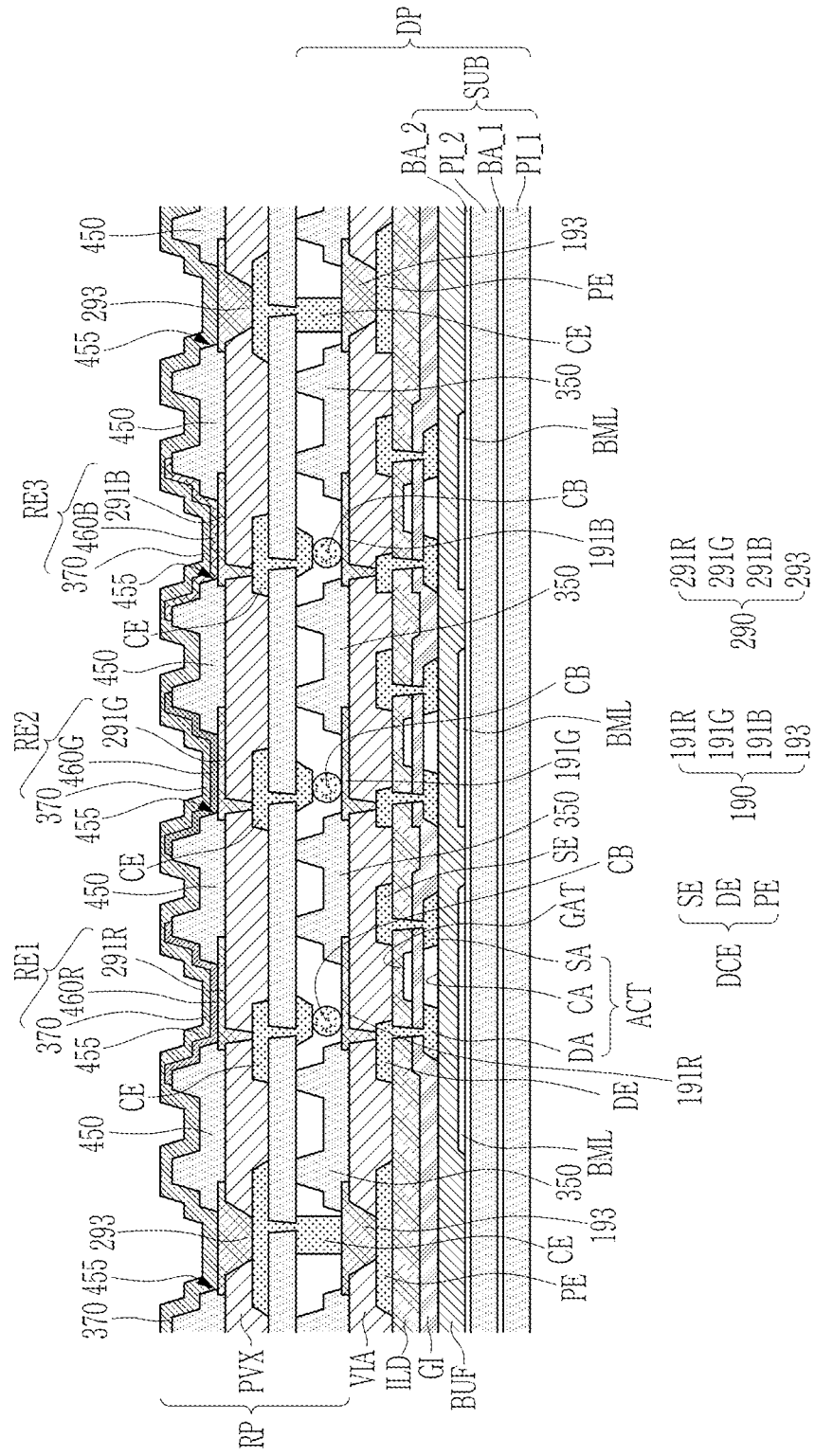
FIG. 8 illustrates a cross-section corresponding to FIG. 6 for a display device according to another embodiment.

FIG. 8 illustrates a cross-section corresponding to FIG. 6 for a display device according to another embodiment. Referring to FIG. 8, in the case of the display device according to the present embodiment, in some of repair regions, the connection electrode CE and the electrode layer 190 are directly connected as shown in FIG. 6 except that the connection electrode CE and part of the electrode layer 190 are connected through the conductive ball CB. A detailed description of same constituent elements may be omitted.

Referring to FIG. 8, in the display device according to the present embodiment, regions in which repair light emitting elements RE1, RE2, and RE3 are positioned may be connected through the conductive ball CB. In addition, a region in which the repair light emitting device is not positioned may be directly electrically connected to the electrode layer 190 through the connection electrode CE.

As illustrated in FIG. 8, the repair auxiliary electrode 293 and the auxiliary electrode 193 are electrically connected to each other through the connection electrode CE. In addition, the first electrode 191R and the first repair electrode 291R are electrically connected to each other through the connection electrode CE and the conductive ball CB. The second electrode 191G and the second repair electrode 291G are connected to each other through the connecting electrode CE and the conductive ball CB, and the third electrode 191B and the third repair electrode 291B are also connected to each other through the connection electrode CE and the conductive ball CB.

In this embodiment, a coupling force between the repair panel RP and the display panel DP may be increased by irradiating a laser to a region where the repair auxiliary electrode 293 and the auxiliary electrode 193 are connected through the connection electrode CE. Because a laser irradiation region is a region in which the repair light emitting elements RE1, RE2, and RE3 are not positioned, even when the laser is irradiated, display quality is not affected.

An encapsulation layer positioned on the display device may be included in any of the above-described embodiments.

Figure 9:
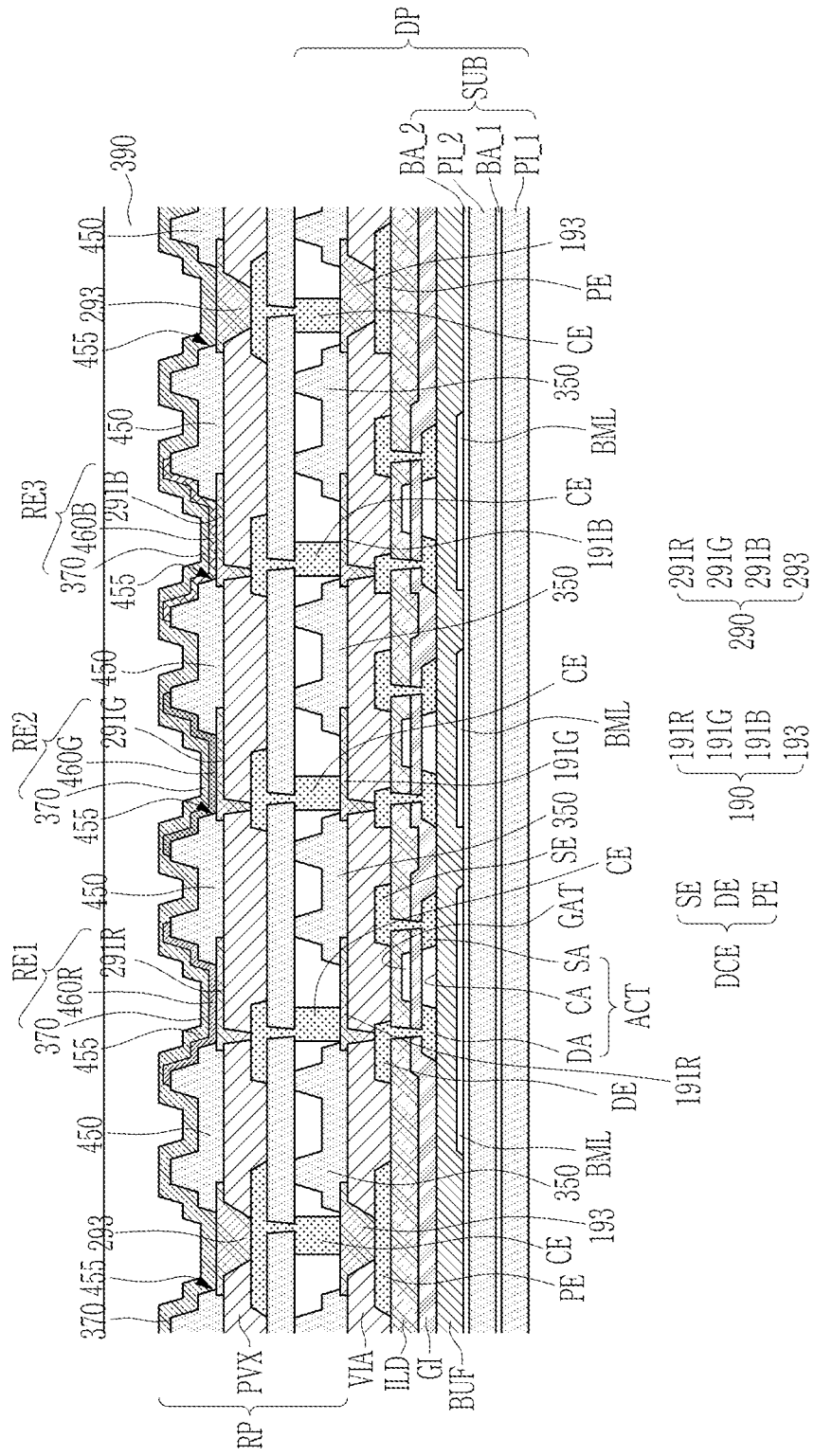
FIG. 9 illustrates a display device including an encapsulation layer with respect to a cross-section corresponding to FIG. 6.

FIG. 9 illustrates a display device including an encapsulation layer 390 with respect to a cross-section corresponding to FIG. 6. Referring to FIG. 9, the display device according to the present embodiment further includes the encapsulation layer 390 positioned on the repair panel RP. The encapsulation layer 390 may have a multilayer structure in which organic layers and inorganic layers are alternately formed.

Figure 10:
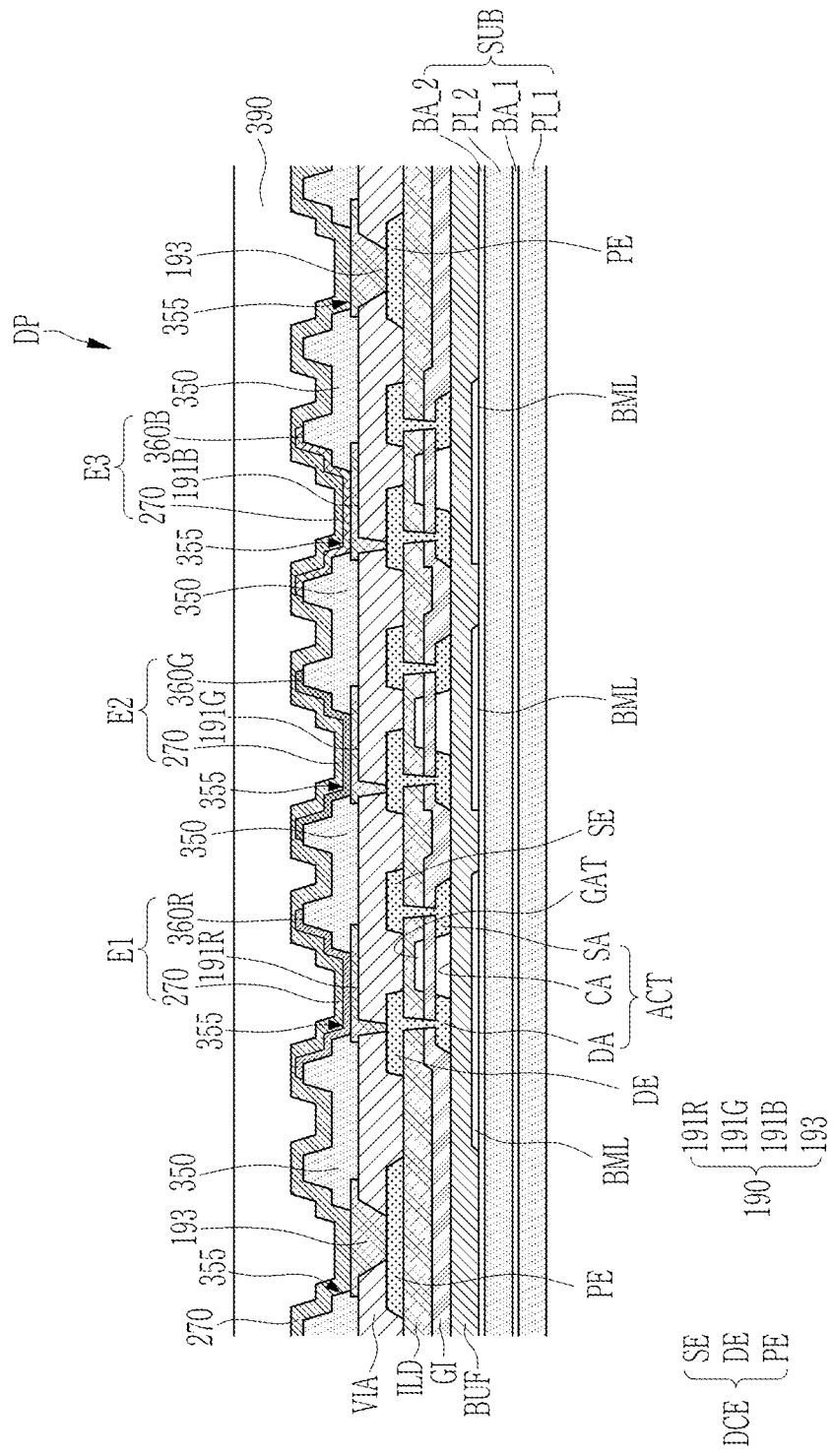
FIG. 10 illustrates a display device including an encapsulation layer with respect to a cross-section corresponding to FIG. 3.

FIG. 10 illustrates a display device including the encapsulation layer 390 with respect to a cross-section corresponding to FIG. 3. FIG. 10 illustrates a region where no repair panel is positioned, and the encapsulation layer 390 may be directly positioned on the display panel DP.

FIG. 9 and FIG. 10 each illustrate a cross-sectional view of an embodiment in which the repair panel RP includes no repair encapsulation layer. However, when the repair panel RP includes the repair encapsulation layer 490 as illustrated in, for example, FIG. 5, both the repair encapsulation layer 490 and the encapsulation layer 390 may be positioned in the display device in which the repair panel RP is stacked.

Figure 11:
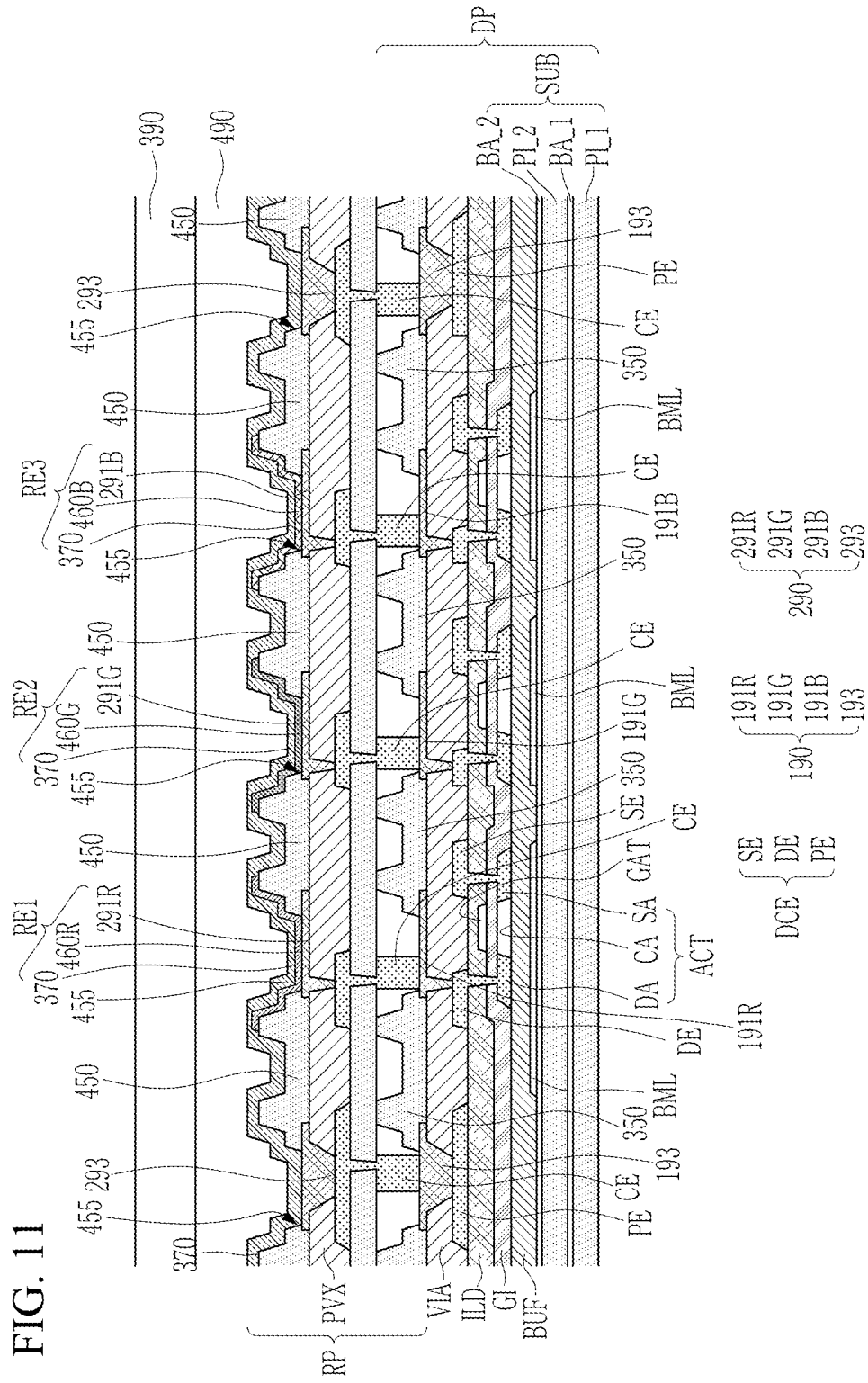
FIG. 11 illustrates an embodiment in which a repair panel including a repair encapsulation layer is stacked as shown in FIG. 5.

FIG. 11 illustrates an embodiment in which the repair panel RP including the repair encapsulation layer 490 is stacked as illustrated in FIG. 5. The cross-section of FIG. 11 corresponds to FIG. 9 and is the same as that shown in FIG. 9 except that the repair encapsulation layer 490 is included. A detailed description of same constituent elements may be omitted. Referring to FIG. 11, the encapsulation layer 390 may be positioned on the repair encapsulation layer 490. For example, when the repair panel RP includes the repair encapsulation layer 490, both the repair encapsulation layer 490 and the encapsulation layer 390, which is disposed throughout the panel, may be disposed in the repaired region.

Hereinafter, a repair process of the display device will be described with reference to the drawings. FIG. 12 to FIG. 15 illustrate a repair process of a display device according to an embodiment.

Figure 12:
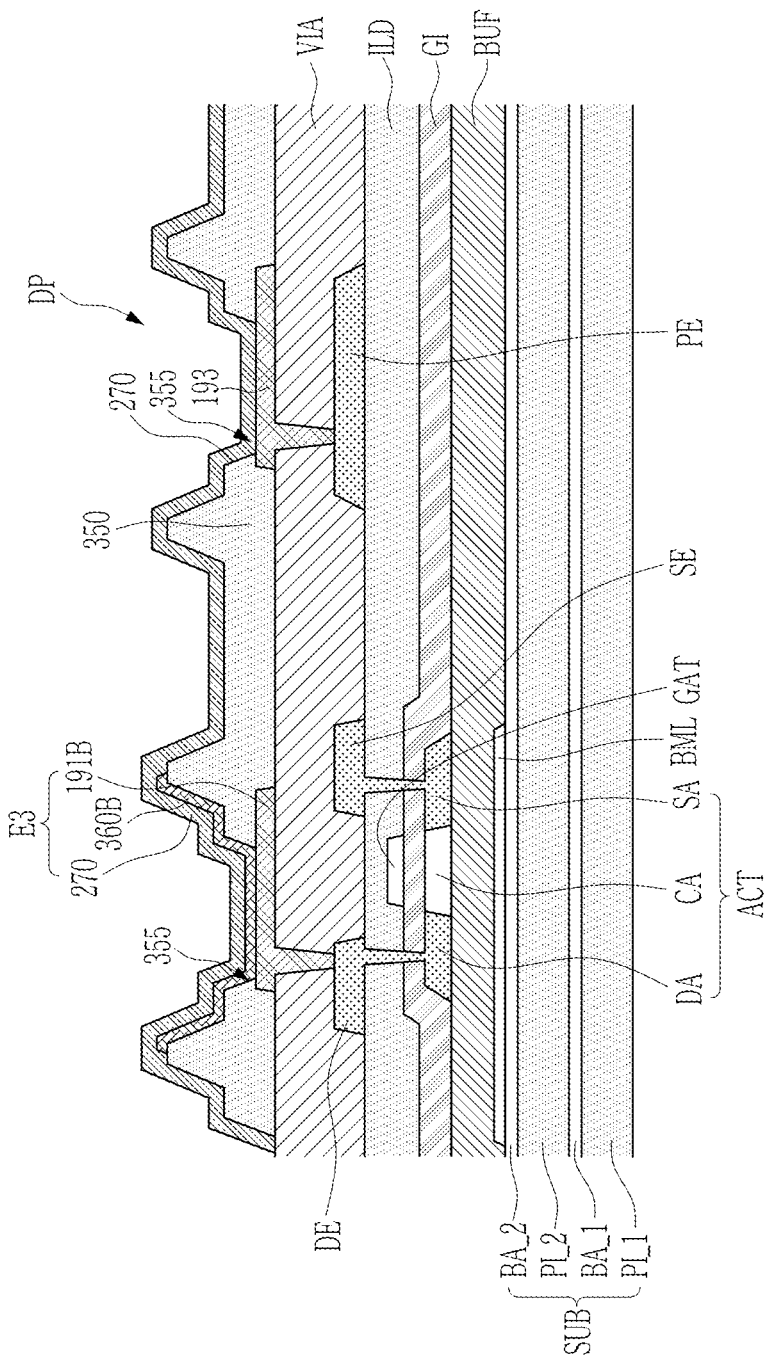
FIG. 12 to FIG. 15 illustrate a repair process of a display device according to an embodiment.

Referring to FIG. 12, the display panel DP is positioned. For the display panel DP shown in FIG. 12, only the region indicated by "B" in the display panel DP shown in FIG. 3 is illustrated. A detailed description of same constituent elements may be omitted. Hereinafter, for convenience of description, the third light emitting element E3 has been described as an example, but the following description may be equally applied to the first light emitting element E1 and the second light emitting element E2 described above.

The display panel DP illustrated in FIG. 12 is a display panel in need of repair. Here, the third light-emitting element E3 is defective in that light does not occur (e.g., the third light-emitting element E3 does not emit light).

Figure 13:
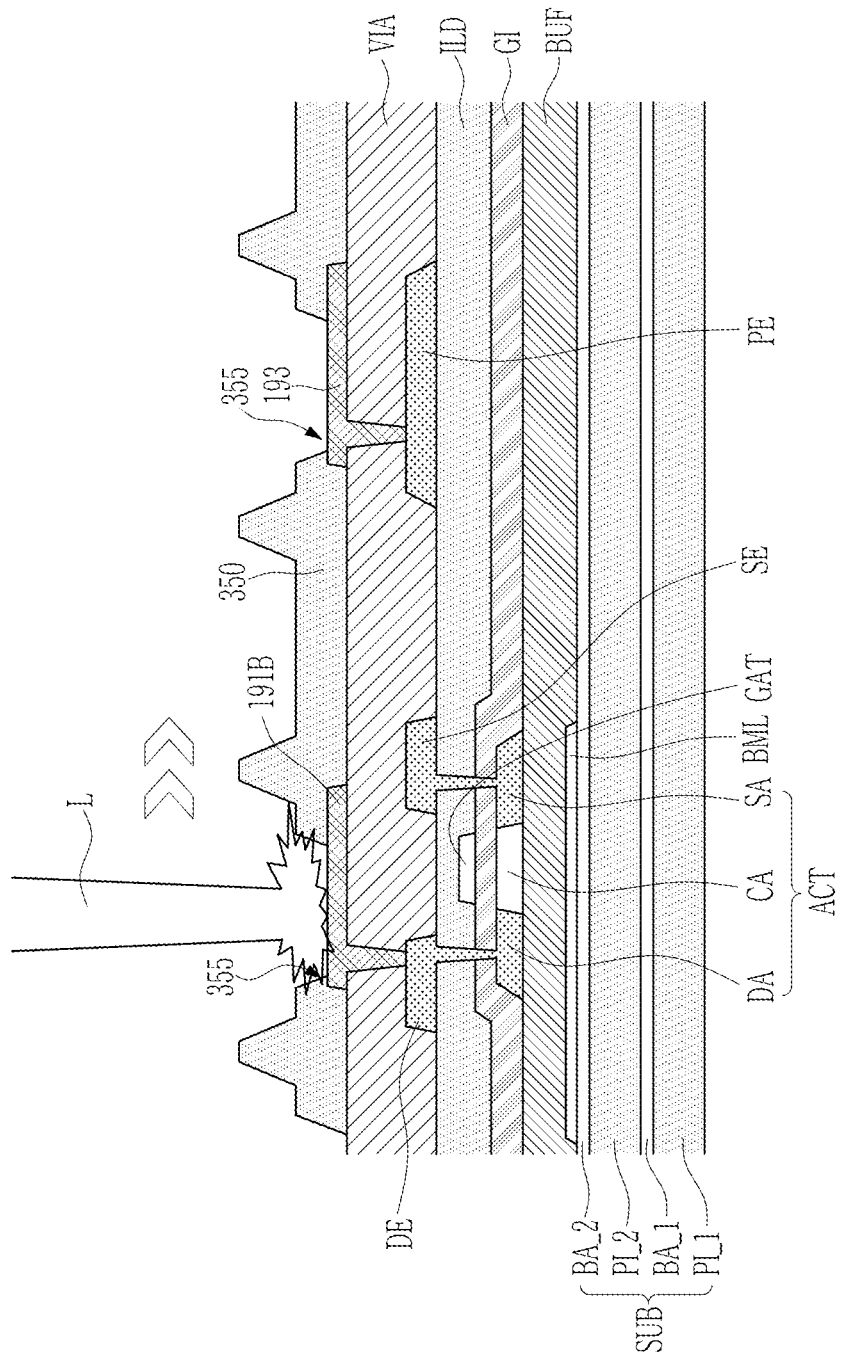

Accordingly, referring to FIG. 13, the common electrode 270 and the third emission layer 360B are removed for repair.

As illustrated in FIG. 13, as a laser L moves in a direction, the common electrode 270 and the third emission layer 360B positioned on the display panel DP may be removed. In other embodiments, the common electrode 270 and the third emission layer 360B may be removed by attaching a viscous tape to an upper portion of the display panel DP and then peeling it off.

Even though the display panel is partially damaged during the removal process, when a portion of the partition wall 350 and a portion of the third electrode 191B remain, there is no problem in a subsequent process. Because the partition wall 350 may be partially damaged in the process of removing the common electrode 270 and the third emission layer 360B, a thickness of the partition wall 350 of the display panel DP in a repaired region may be thinner than that of the partition wall 350 of the display panel DP in a non-repaired region.

Figure 14:
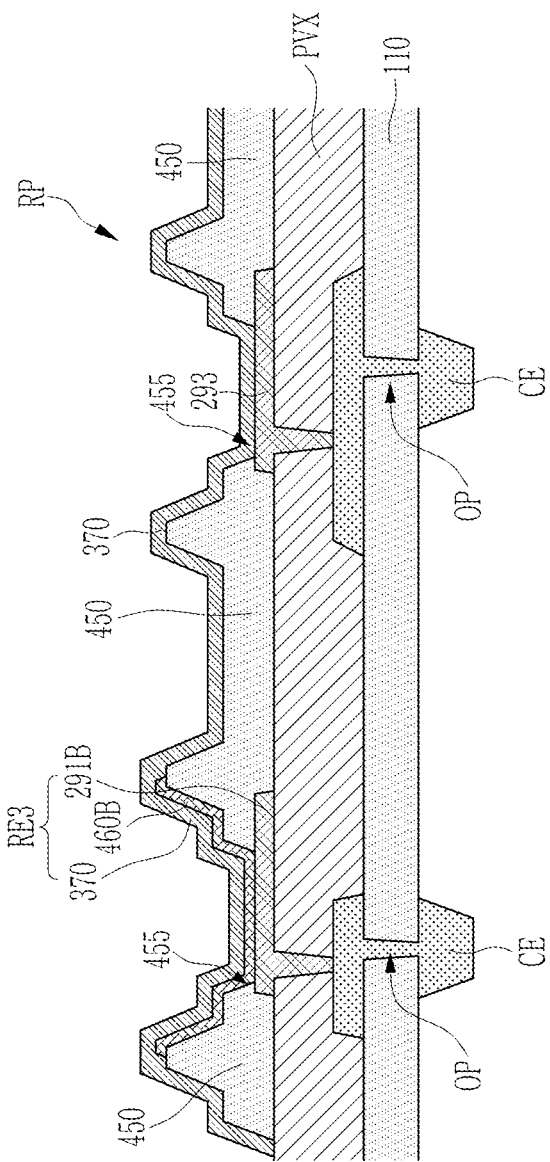

Next, referring to FIG. 14, the repair panel RP is prepared. The repair panel RP shown in FIG. 14 corresponds to an area indicated by "C" in the repair panel RP shown in FIG. 4. Components of the repair panel RP are the same as those described in FIG. 4, and thus, a detailed description of the same components may be omitted.

Figure 15:
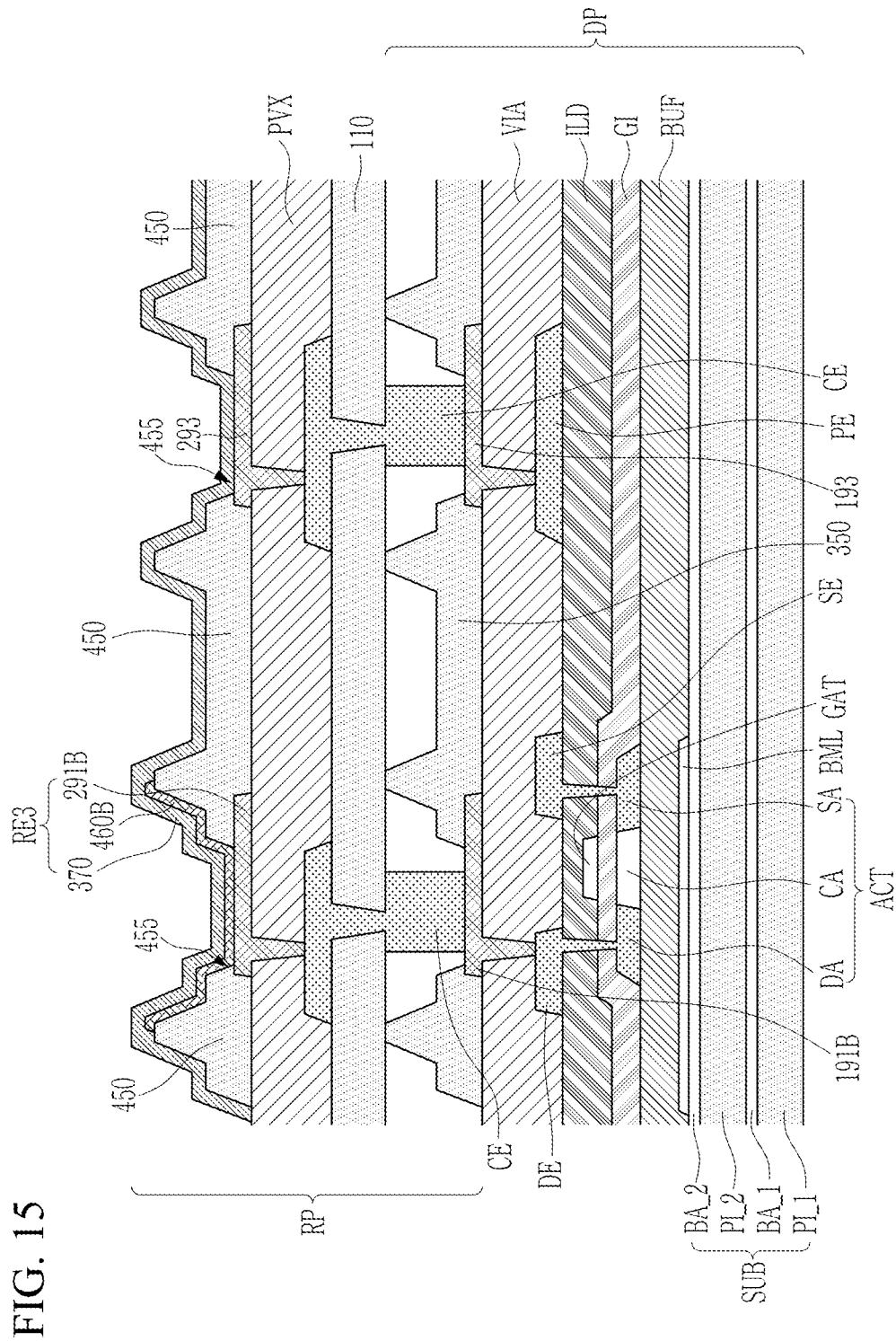

Referring to FIG. 15, the repair panel RP shown in FIG. 14 is positioned on the display panel DP as illustrated in FIG. 13 from which the common electrode 270 and the third emission layer 360B are removed. The auxiliary electrode 193 and the repair auxiliary electrode 293 may be electrically connected to each other by the connection electrode CE, and the third electrode 191B and the third repair electrode 291B may be electrically connected to each other by the connection electrode CE. A micro electrostatic chuck may be used to position the repair panel RP on the display panel DP. A process of positioning the repair panel RP on the display panel DP may be performed in a vacuum chamber.

A coupling force between the display panel DP and the repair panel RP may be increased through laser welding by irradiating a laser to a region where the auxiliary electrode 193 and the repair auxiliary electrode 293 are connected.

As illustrated in FIG. 15, the display panel DP and the repair panel RP may be electrically connected through the connection electrode CE, and a voltage applied to the third electrode 191B may be transferred to the third repair electrode 291B through the connection electrode CE to cause the third repair light emitting element RE3 to emit light. Accordingly, the display device may be effectively repaired. Although the third repair light emitting element RE3 has been described, the same description may be applied to other repair light emitting elements.

Figure 16:
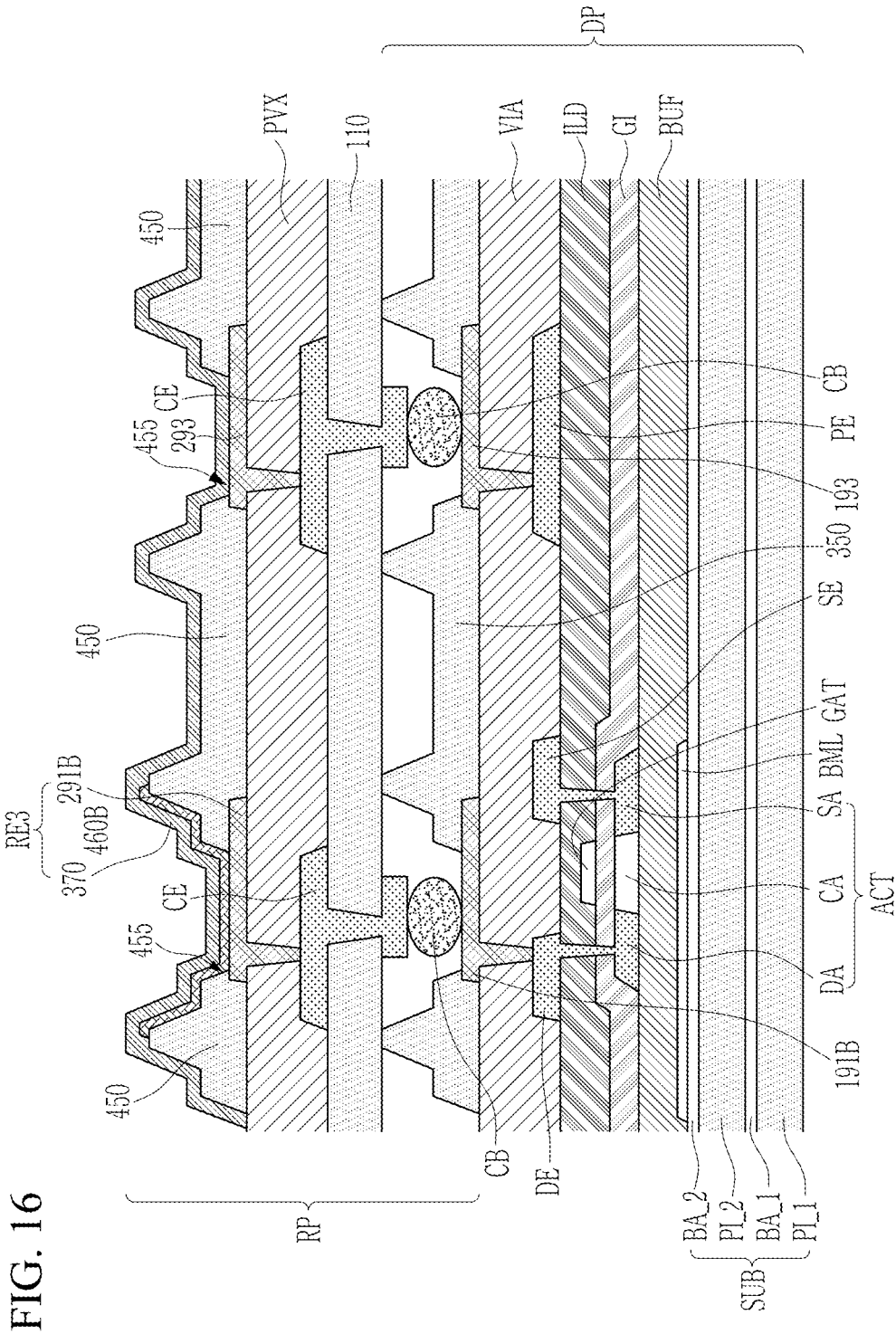
FIG. 16 illustrates a cross-section corresponding to FIG. 15 for a display device according to another embodiment.

FIG. 16 illustrates a cross-section corresponding to FIG. 15 for a display device according to another embodiment. Referring to FIG. 16, the display device according to the present embodiment is the same as that of the embodiment shown in FIG. 15 except that the repair panel RP and the display panel DP are electrically connected through the conductive balls CB. A detailed description of same constituent elements may be omitted.

Referring to FIG. 16, the auxiliary electrode 193 and the repair auxiliary electrode 293 are connected through the connection electrode CE and the conductive ball CB. In addition, the third electrode 191B and the third repair electrode 291B may be electrically connected to each other through the connecting electrode CE and the conductive ball CB. To this end, before positioning the repair panel RP on the display panel DP, the method may further include positioning a conductive ball CB on the display panel DP.

Figure 17:
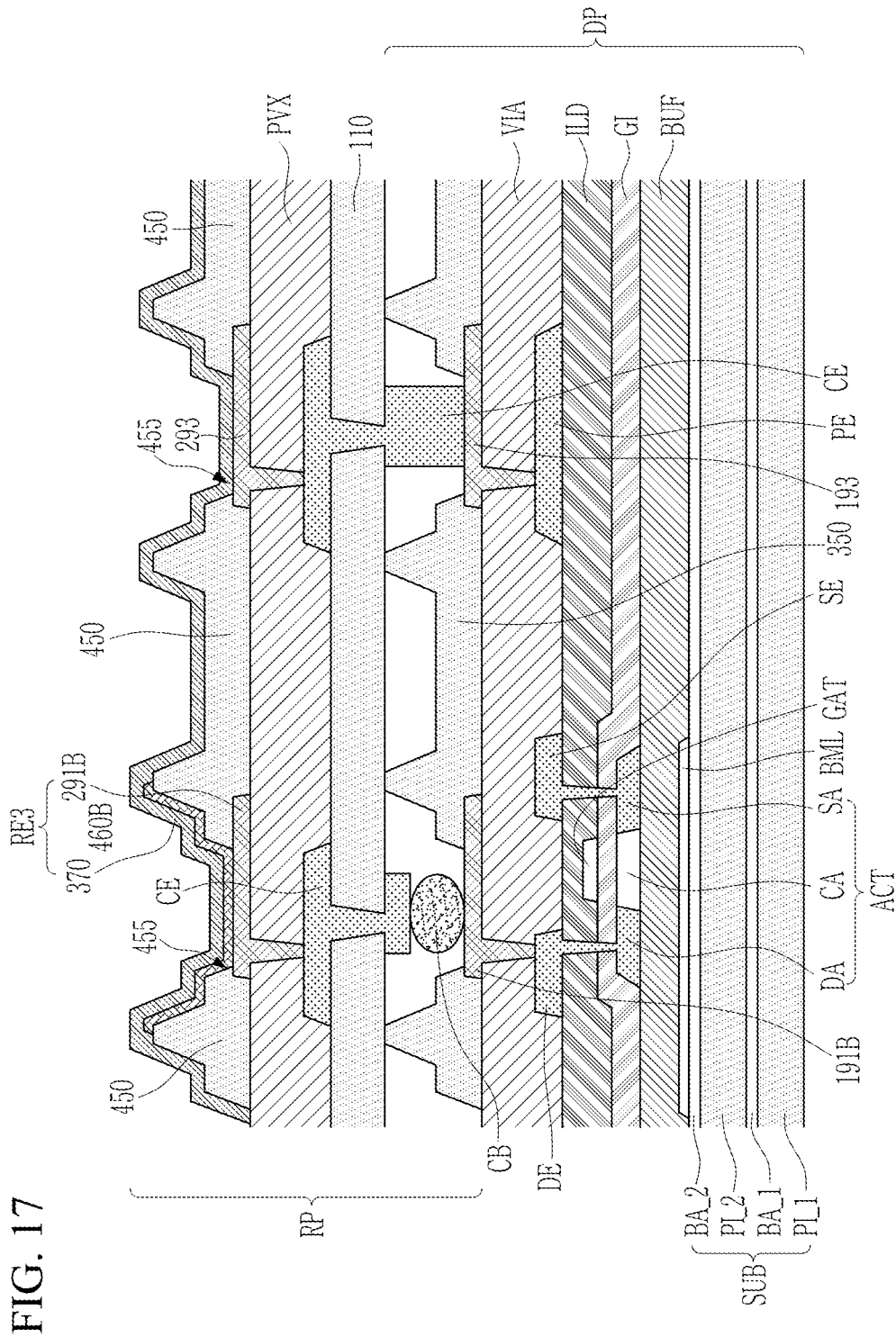
FIG. 17 illustrates a cross-section corresponding to FIG. 15 for a display device according to another embodiment.

FIG. 17 illustrates a cross-section corresponding to FIG. 15 for a display device according to another embodiment. Referring to FIG. 17, the display device according to the present embodiment is the same as that of the embodiment shown in FIG. 15 except that the conductive ball CB is partially used to connect the repair panel RP and the display panel DP. A detailed description of same constituent elements may be omitted.

Referring to FIG. 17, the third electrode 191B and the third repair electrode 291B may be electrically connected to each other through the connecting electrode CE and the conductive ball CB, but the auxiliary electrode 193 and the repair auxiliary electrode 293 may be electrically connected to each other only by the connection electrode CE without using the conductive ball CB. A coupling force between the display panel DP and the repair panel RP may be further increased through laser welding by irradiating a laser to a region where the auxiliary electrode 193 and the repair auxiliary electrode 293 are electrically connected.

As described above, according to the present disclosure, the display panel is repaired by positioning the repair panel on the display panel. A portion of the display panel is removed by, for example, using a laser, and the display panel and the repair panel are electrically connected to each other through the connection electrode. Accordingly, the display device may be effectively repaired.

While the present disclosure has been described in connection with embodiments thereof, it is to be understood that the present disclosure is not limited to the disclosed embodiments but is intended to cover various modifications and equivalent arrangements included within the spirit and scope of the appended claims and their equivalents.

| Description of Some Reference Symbols | |
|---|---|
| DP: display panel | RP: repair panel |
| SUB: substrate | 110: repair substrate |
| 190: electrode layer | 290: repair electrode layer |
| 270: common electrode | 370: repair common electrode |
| CE: connection electrode | CB: conductive ball |
| 390: encapsulation layer | 490: repair encapsulation layer |
| 193: auxiliary electrode | 293: repair auxiliary electrode |

What is claimed is:
1. A display device comprising:
a display panel comprising:
  a substrate;
  a plurality of transistors on the substrate; and
  a first electrode connected to the transistors; and
a repair panel overlapping a region of the display panel, the repair panel comprising:
  a repair substrate;
  a plurality of connection electrodes extending through the repair substrate and on opposite surfaces of the repair substrate;

a first repair electrode connected to the connection electrodes;
a first repair emission layer on the first repair electrode; and
a repair common electrode on the first repair emission layer,
wherein, in a region where the display panel and the repair panel overlap each other, the first electrode and the first repair electrode are electrically connected to each other through the connection electrode.

2. The display device of claim 1, wherein the display panel further comprises an auxiliary electrode on a same layer as that of the first electrode,
wherein the repair panel further comprises a repair auxiliary electrode on a same layer as that of the first repair electrode,
wherein the repair auxiliary electrode is electrically connected to the repair common electrode, and
wherein the auxiliary electrode and the repair auxiliary electrode are electrically connected to each other through the connection electrode.

3. The display device of claim 2, further comprising:
a first conductive ball between the first electrode and the connection electrode; and
a second conductive ball between the auxiliary electrode and the connection electrode.

4. The display device of claim 1, further comprising a conductive ball between the first electrode and the connection electrode.

5. The display device of claim 1, wherein the display panel, at a region that does not overlap the repair panel, further comprises:
a first emission layer on the first electrode;
a common electrode on the first emission layer; and
an auxiliary electrode on a same layer as that of the first electrode and electrically connected to the common electrode.

6. The display device of claim 1, wherein the display panel further comprises a second electrode and a third electrode on a same layer as that of the first electrode.

7. The display device of claim 6, wherein the repair panel further comprises:
a second repair electrode and a third repair electrode on a same layer as that of the first repair electrode;
a second repair emission layer on the second repair electrode; and
a third repair emission layer on the third repair electrode.

8. The display device of claim 7, wherein, in a region where the display panel and the repair panel overlap each other, the second electrode is electrically connected to the second repair electrode through the connection electrode, and the third electrode and the third repair electrode are electrically connected to each other through the connection electrode.

9. The display device of claim 8, wherein, in a region where the display panel and the repair panel overlap each other, the first repair emission layer, the second repair emission layer, and the third repair emission layer are configured to emit light when a voltage is applied to the display device.

10. The display device of claim 1, wherein a thickness of the display device in a region where the repair panel is positioned is thicker than a region where the repair panel is not positioned.

11. The display device of claim 1, wherein the repair panel further comprises a repair encapsulation layer on the repair common electrode.

12. The display device of claim 11, further comprising an encapsulation layer on the repair encapsulation layer,
wherein the encapsulation layer is integrally positioned on the repair panel and on the display panel that does not overlap the repair panel.

13. A repair method for a display device comprising a display panel using a repair panel, the display panel comprises: a substrate; a plurality of transistors on the substrate; and a first electrode connected to the transistors, the repair panel comprises: a repair substrate; a plurality of connection electrodes extending through the repair substrate and on opposite surfaces of the repair substrate; a first repair electrode connected to the connection electrodes; a first repair emission layer on the first repair electrode; and a repair common electrode on the first repair emission layer, the repair method comprising:
determining whether or not a defective region is present by turning on the display panel;
removing an emission layer and a common electrode from the display panel by irradiating a laser to the defective region of the display panel;
positioning the repair panel on the display panel irradiated with the laser; and
electrically connecting the first electrode and the connection electrode in a region where the display panel and the repair panel overlap each other.

14. The repair method of claim 13, wherein
the display panel further comprises an auxiliary electrode on a same layer as that of the first electrode, and
the repair panel further comprises a repair auxiliary electrode on a same layer as that of the first repair electrode,
the repair auxiliary electrode is electrically connected to the repair common electrode, and
the auxiliary electrode and the repair auxiliary electrode are electrically connected to each other through the connection electrode.

15. The repair method of claim 14, wherein, after the positioning of the repair panel on the display panel irradiated with the laser, a laser is irradiated to a region where the repair auxiliary electrode and the auxiliary electrode are connected to couple the display panel and the repair panel to each other.

16. The repair method of claim 14, further comprising, before the positioning of the repair panel on the display panel irradiated with the laser, positioning a conductive ball between the display panel and the repair panel.

17. The repair method of claim 16, wherein the conductive ball is positioned between the first electrode and the connection electrode and between the auxiliary electrode and the connection electrode.

18. The repair method of claim 13, wherein the repair panel further comprises a repair encapsulation layer on the repair common electrode, and
wherein an encapsulation layer is integrally disposed on the repair encapsulation layer and the display panel which does not overlap the repair panel.

19. The repair method of claim 13, wherein a thickness of the display device in a region where the repair panel is positioned is thicker than a region where the repair panel is not positioned.

20. The repair method of claim 13, wherein the display panel, in a region that does not overlap the repair panel, further comprises:
a first emission layer on the first electrode;
the common electrode on the first emission layer; and an auxiliary electrode on a same layer as that of the first electrode and electrically connected to the common electrode.

\* \* \* \* \*